(12) United States Patent
Kim

(10) Patent No.: US 9,711,654 B2
(45) Date of Patent: Jul. 18, 2017

(54) DISPLAY DEVICE

(71) Applicant: Samsung Display Co., Ltd., Yongin (KR)

(72) Inventor: Moojong Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 105 days.

(21) Appl. No.: 14/720,327

(22) Filed: May 22, 2015

(65) Prior Publication Data

US 2016/0035303 A1    Feb. 4, 2016

(30) Foreign Application Priority Data

Jul. 30, 2014   (KR) .................. 10-2014-0097471

(51) Int. Cl.
| | |
|---|---|
| *G09G 3/36* | (2006.01) |
| *G09G 5/18* | (2006.01) |
| *H01L 29/786* | (2006.01) |
| *H01L 29/417* | (2006.01) |
| *G02F 1/1368* | (2006.01) |
| *H01L 27/12* | (2006.01) |

(52) U.S. Cl.
CPC ...... *H01L 29/78696* (2013.01); *G02F 1/1368* (2013.01); *H01L 29/41733* (2013.01); *H01L 29/78648* (2013.01); *G09G 3/3677* (2013.01); *G09G 2300/0408* (2013.01); *G09G 2310/0286* (2013.01); *H01L 27/1251* (2013.01)

(58) Field of Classification Search
None
See application file for complete search history.

(56) References Cited

U.S. PATENT DOCUMENTS

| | | | |
|---|---|---|---|
| 7,804,095 B2 | 9/2010 | Sato | |
| 8,067,775 B2 | 11/2011 | Miyairi et al. | |
| 8,278,162 B2 | 10/2012 | Akimoto et al. | |
| 8,395,157 B2 | 3/2013 | Park et al. | |
| 2010/0244029 A1* | 9/2010 | Yamazaki | H01L 27/1225 257/52 |
| 2012/0200511 A1* | 8/2012 | Kim | G06F 3/0421 345/173 |
| 2013/0113772 A1 | 5/2013 | Kang et al. | |
| 2017/0052415 A1* | 2/2017 | Yamazaki | G02F 1/134309 |

FOREIGN PATENT DOCUMENTS

| | | |
|---|---|---|
| JP | 2005-072144 | 3/2005 |
| JP | 2010-245162 | 10/2010 |
| JP | 2013-021316 | 1/2013 |
| KR | 10-1107697 | 1/2012 |
| KR | 10-1275710 | 6/2013 |

\* cited by examiner

*Primary Examiner* — Carolyn R Edwards
*Assistant Examiner* — Krishna Neupane
(74) *Attorney, Agent, or Firm* — H.C. Park & Associates, PLC

(57) ABSTRACT

A display device including: a first base substrate including a display area and a non-display area adjacent to the display area; a plurality of signal lines disposed in the display area; a plurality of pixels disposed in the display area and connected to the signal lines; and a driving circuit disposed in the non-display area and configured to provide driving signals to the signal lines. Each of the pixels includes a switching transistor connected to a corresponding signal line, and a display element connected to the switching transistor.

13 Claims, 12 Drawing Sheets

ＵＳ 9,711,654 B2

DISPLAY DEVICE

CROSS-REFERENCE TO RELATED APPLICATION

This application claims priority from and the benefit of Korean Patent Application No. 10-2014-0097471, filed on Jul. 30, 2014, which is hereby incorporated by reference for all purposes as if fully set forth herein.

BACKGROUND

Field

Exemplary embodiments relate to a display device, and more particularly, to a display device having a reduced circuit area.

Discussion of the Background

A display device includes a plurality of pixels, and a gate driving circuit and a data driving circuit driving the pixels. Each of the pixels is connected to a corresponding gate line among a plurality of gate lines and a corresponding data line among a plurality of data lines.

The gate driving circuit provides gate signals to the gate lines and the data driving circuit provides data signals to the data lines. The gate driving circuit includes a plurality of stage circuits. The stage circuits sequentially output the gate signals to the gate lines. Each of the stage circuits includes a plurality of thin film transistors connected to each other organically.

Each of the pixels includes a thin film transistor receiving a corresponding gate signal among the gate signals and a corresponding data signal among the data signals.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device including a thin film transistor with excellent operating characteristics.

Additional aspects will be set forth in the detailed description which follows, and, in part, will be apparent from the disclosure, or may be learned by practice of the inventive concept.

An exemplary embodiment of the present invention discloses a display device including: a first base substrate including a display area and a non-display area adjacent to the display area; a plurality of signal lines disposed in the display area; a plurality of pixels disposed in the display area and connected to the signal lines; and a driving circuit disposed in the non-display area and configured to provide driving signals to the signal lines. Each of the pixels includes a switching transistor connected to a corresponding signal line, and a display element connected to the switching transistor. The switching transistor includes a first control electrode disposed on one side of the first base substrate, a first active layer disposed on the first control electrode, a first input electrode and a first output electrode disposed on the first active layer, a second active layer disposed on the first active layer and covering the first input electrode and the first output electrode, and a second control electrode disposed on the second active layer and electrically connected to the first control electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description, serve to explain principles of the inventive concept.

DETAILED DESCRIPTION OF THE ILLUSTRATED EMBODIMENTS

Figure 1:
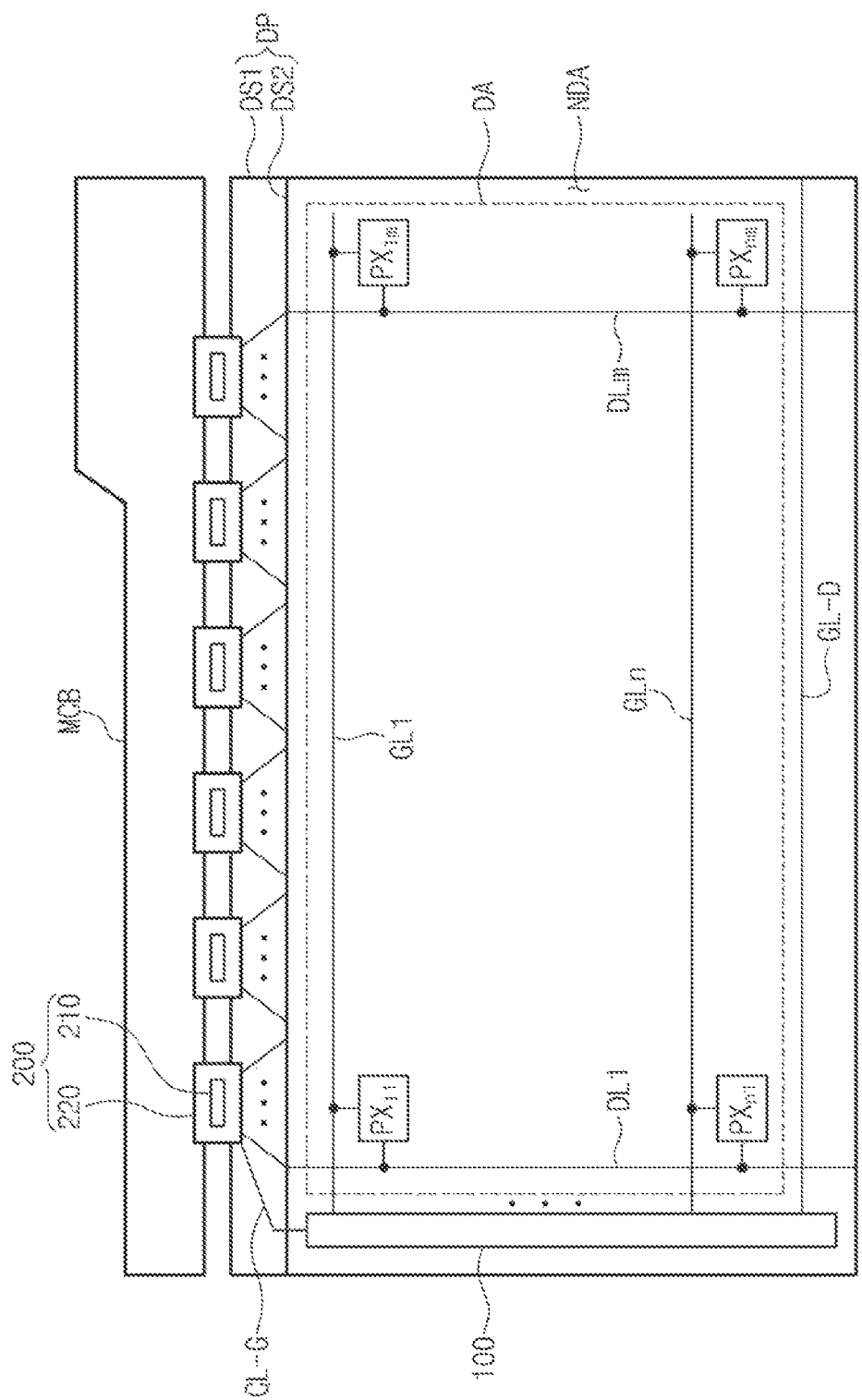
FIG. 1 is a plan view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As shown in FIG. 1, the display device includes a display panel DP, a gate driving circuit 100, and a data driving circuit 200.

The display panel DP may include one of various types of display panels, for example, a liquid crystal display panel, an organic light emitting display panel, an electrophoretic display panel, and an electrowetting display panel. According to the type of the display panel DP, the number of base substrates, the configuration of a pixel (that is, a display element and a circuit unit driving the display element), and a configuration of a driving circuit may vary.

In this exemplary embodiment, the display panel DP is a liquid crystal display panel. Moreover, a liquid display device including a liquid crystal display panel may further include a polarizer (not shown) and a backlight unit (not shown).

The display panel DP includes a first substrate DS1, a second substrate DS2 spaced from the first substrate DS1, and a liquid crystal layer (not shown) between the first substrate DS1 and the second substrate DS2. The display panel DP includes a display area DA where a plurality of pixels PX11 to PXnm are disposed and a non-display area NDA surrounding the display area DA. Only some of the pixels PX11 to PXnm are shown in FIG. 1.

Figure 4:
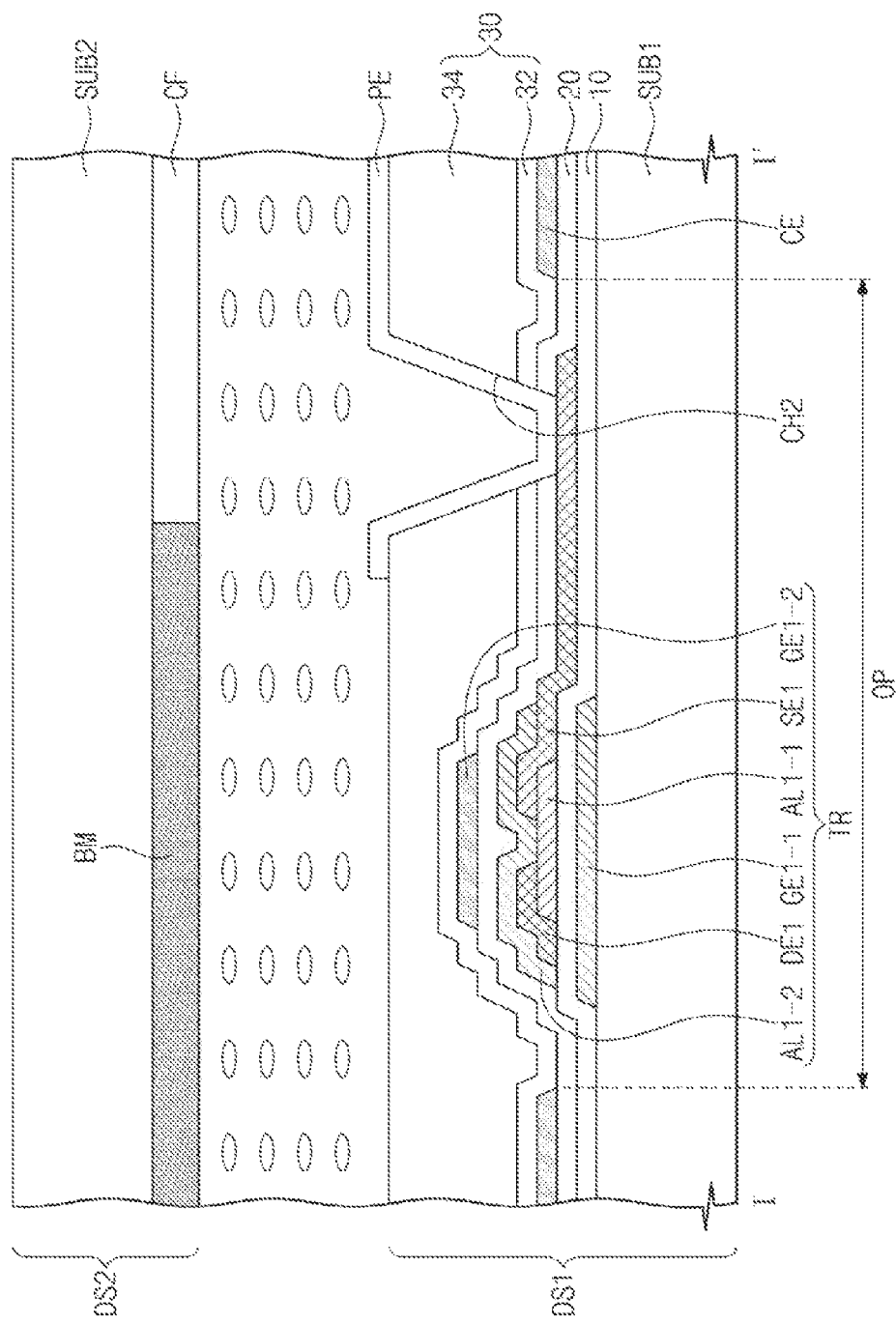
FIG. 4 is a sectional view of a display panel taken along a line I-I' of FIG. 3A.

The first substrate DS1 includes a plurality of signal lines disposed on a first base substrate SUB1 (see FIG. 4). The signal lines include a plurality of gate lines GL1 to GLn and a plurality of data lines DL1 to DLm intersecting the gate lines GL1 to GLn. The gate lines GL1 to GLn and the data lines DL1 to DLm are respectively connected to corresponding pixels among the pixels PX11 to PXnm. Only some of the gate lines GL1 to GLn and some of the plurality of data lines DL1 to DLm are shown in FIG. 1.

The first substrate DS1 may further include a dummy gate line GL-D disposed on one side, which is not be connected to the pixels PX11 to PXnm, and may be disposed on the non-display area NDA.

The gate lines GL1 to GLn are connected to the gate driving circuit 100. The gate driving circuit 100 may sequentially output gate signals to the gate lines GL1 to GLn. The gate driving circuit 100 and the pixels PX11 to PXnm may be formed simultaneously through a thin film process. For example, the gate driving circuit 100 may be mounted on the non-display area NDA in an amorphous silicon TFT gate driver circuit (ASG) form.

FIG. 1 illustrates an exemplary embodiment in which one gate driving circuit 100 is connected to the left ends of the gate lines GL1 to GLn. According to another exemplary embodiment of the present invention, the display device may include two gate driving circuits 100. One of the two gate driving circuits 100 may be connected to the left ends of the gate lines GL1 to GLn, and the other one of the two gate driving circuits 100 may be connected to the right ends of the gate lines GL1 to GLn. Additionally, one of the two gate driving circuits 100 may be connected to the odd-numbered gate lines, and the other one may be connected to the even-numbered gate lines.

The data driving circuit 200 receives image data outputted from a timing controller (not shown) mounted on a main circuit substrate MBC. The data driving circuit 200 generates analog data signals corresponding to the image data.

The data lines DL1 to DLm are connected to the data driving circuit 200. The data lines DL1 to DLm receive the data signals outputted from the data driving circuit 200.

The data driving circuit 200 may include a driving chip 210 and a flexible circuit substrate 220 at the point where the driving chip 210 is mounted. The flexible circuit substrate 220 electrically connects the main circuit substrate MCB and the first substrate DS1. The driving chips 210 provide data signals to corresponding data lines among the data lines DL1 to DLm.

FIG. 1 illustrates an exemplary embodiment in which the data driving circuit 200 includes a plurality of tape carrier package (TCP) type driving circuits. According to an exemplary embodiment, the data driving circuit 200 may be disposed on the non-display area NDA of the first substrate DS1 in a chip on glass (COG) manner. Additionally, according to an exemplary embodiment, the data driving circuit 200 and the pixels PX11 to PXnm may be formed simultaneously through a thin film process.

Figure 2:
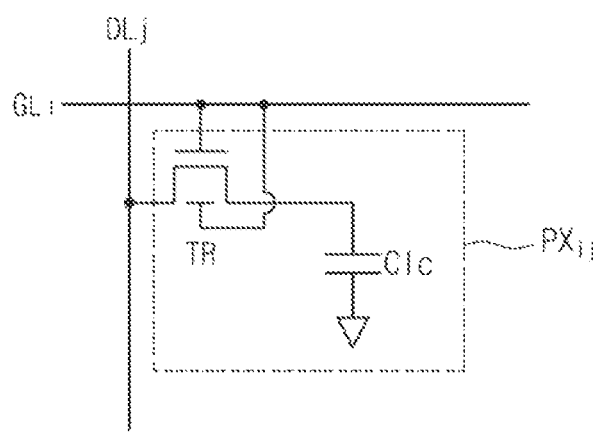
FIG. 2 is an equivalent circuit diagram of a pixel according to an exemplary embodiment of the present invention.

FIG. 2 is an equivalent circuit diagram of a pixel PXij according to an exemplary embodiment of the present invention. Each of the plurality of pixels PX11 to PXnm shown in FIG. 1 may have the equivalent circuit shown in FIG. 2.

As shown in FIG. 2, the pixel PXij includes a thin film transistor TR, hereinafter referred to as a switching transistor, and a liquid crystal capacitor Clc. According to an exemplary embodiment of the present invention, the pixel PXij may further include a storage capacitor connected in parallel with the liquid crystal capacitor Clc. The liquid crystal capacitor Clc corresponds to a display element, and the switching transistor TR corresponds to a circuit unit driving the display element.

The switching transistor TR is electrically connected to the ith gate line GLi and the jth data line DLj. The switching transistor TR includes two control electrodes. The two control electrodes are connected to the ith gate line GLi. Although not shown in the drawing, the switching transistor TR includes two active layers. As the switching transistor TR is turned on, the two active layers form channels, respectively. The switching transistor TR outputs pixels voltages corresponding to data signals received from the jth data line DLj in response to a gate signal received from the ith gate line GLi.

The liquid crystal capacitor Clc is charged with the pixel voltage outputted from the switching transistor TR. According to the electric charge of the liquid crystal capacitor Clc, the alignment of liquid crystal directors in the liquid crystal layer LCL (see FIG. 3) is changed. According to the alignment of the liquid crystal detectors, a light incident to the liquid crystal layer may be either transmitted or blocked.

Figure 3A:
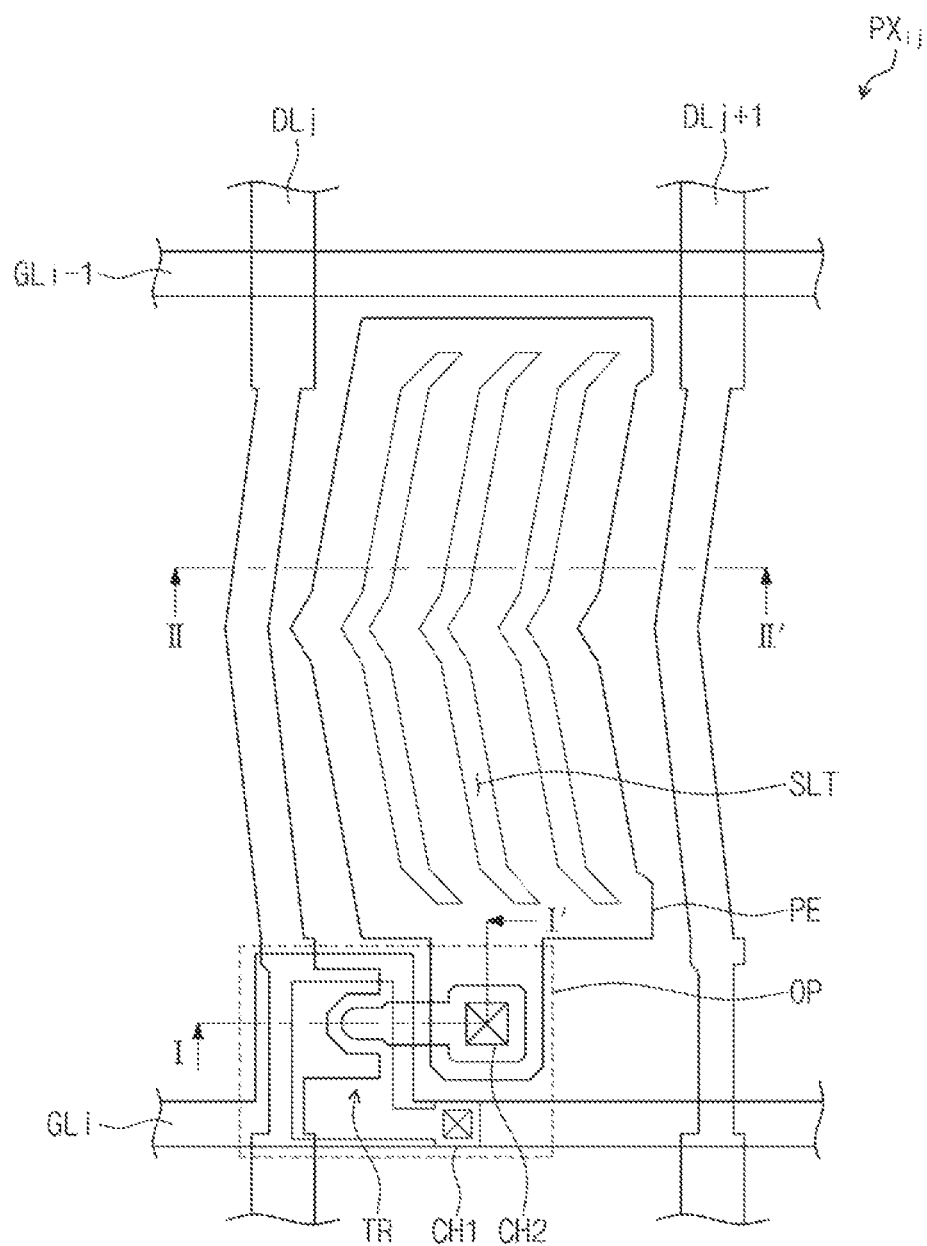
FIG. 3A is a layout diagram of a pixel according to an exemplary embodiment of the present invention.
Figure 3B:
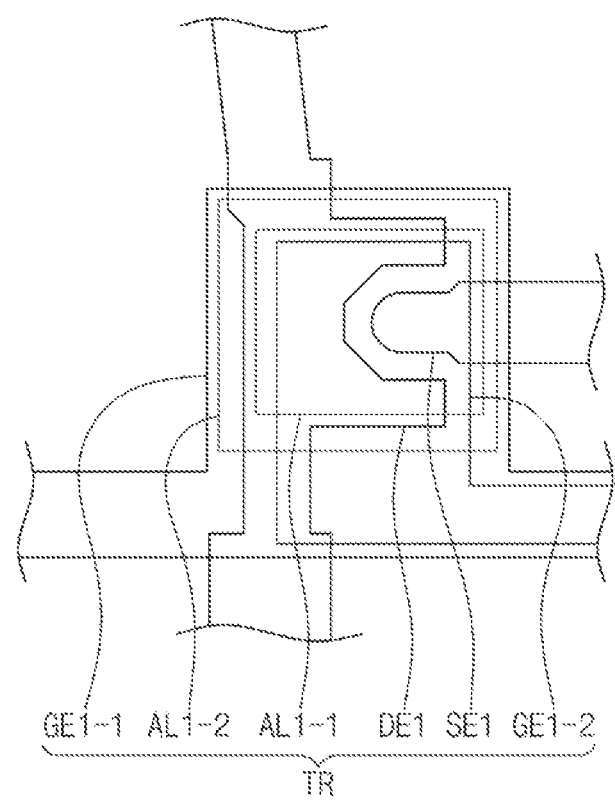
FIG. 3B is an enlarged plan view of a switching transistor shown in FIG. 3A.

FIG. 3A is a layout diagram of a pixel according to an exemplary embodiment of the present invention. FIG. 3B is an enlarged plan view of a switching transistor shown in FIG. 3A.

Although a pixel of a plane to line switching mode is described in this exemplary embodiment, a liquid crystal display panel according to other exemplary embodiments of the present invention may include pixels in a vertical alignment (VA) mode, a patterned vertical alignment (PVA) mode, an in-plane switching (IPS) mode, or a fringe-field switching (FFS) mode.

As shown in FIGS. 3A and 3B, the pixel PXij includes a switching transistor TR, a pixel electrode PE connected to the switching transistor TR, and a common electrode overlapping the pixel electrode PE and including an opening OP. The pixel electrode PE and the common electrode correspond to two electrodes of the liquid crystal capacitor Clc (see FIG. 2). The common electrode overlaps a plurality of pixels and is formed at an entire surface of the display area DA (see FIG. 1). Accordingly, a boundary (or an outline) of the common electrode is not shown in FIG. 3A, which shows only one pixel PXij.

The switching transistor TR includes a first control electrode GE1-1, a first active layer AL1-1, an input electrode DE1, an output electrode SE1, a second active layer AL1-2, and a second control electrode GE1-2. The first control electrode GE1-1 is connected to the ith gate line GLi and is disposed at the same layer as the ith gate line GLi. The second control electrode GE1-2 is disposed at a different layer than the first control electrode GE1-1 and the ith gate line GLi. The second control electrode GE1-2 is connected to the ith gate line GLi through a contact hole CH1 (hereinafter referred to as a first contact hole). According to an exemplary embodiment of the present invention, the second control electrode GE1-2 may be connected to the first control electrode GE1-1 through a contact hole.

The input electrode DE1 is connected to the jth data line DLj and is disposed at the same layer as the jth data line DLj. The first control electrode GE1-1, the input electrode DE1, and the output electrode SE1 partially overlap the first active layer AL1-1. The second active layer AL1-2 is disposed at a different layer than the first active layer AL1-1 and partially overlaps the second control electrode GE1-1, the input electrode DE1, and the output electrode SE1.

The output electrode SE1 is connected to the pixel electrode PE through a contact hole CH2 (hereinafter referred to as a "second contact hole"). A plurality of slits SLT are defined in the pixel electrode PE. The number or form of the slits SLT may be changed.

Figure 5:
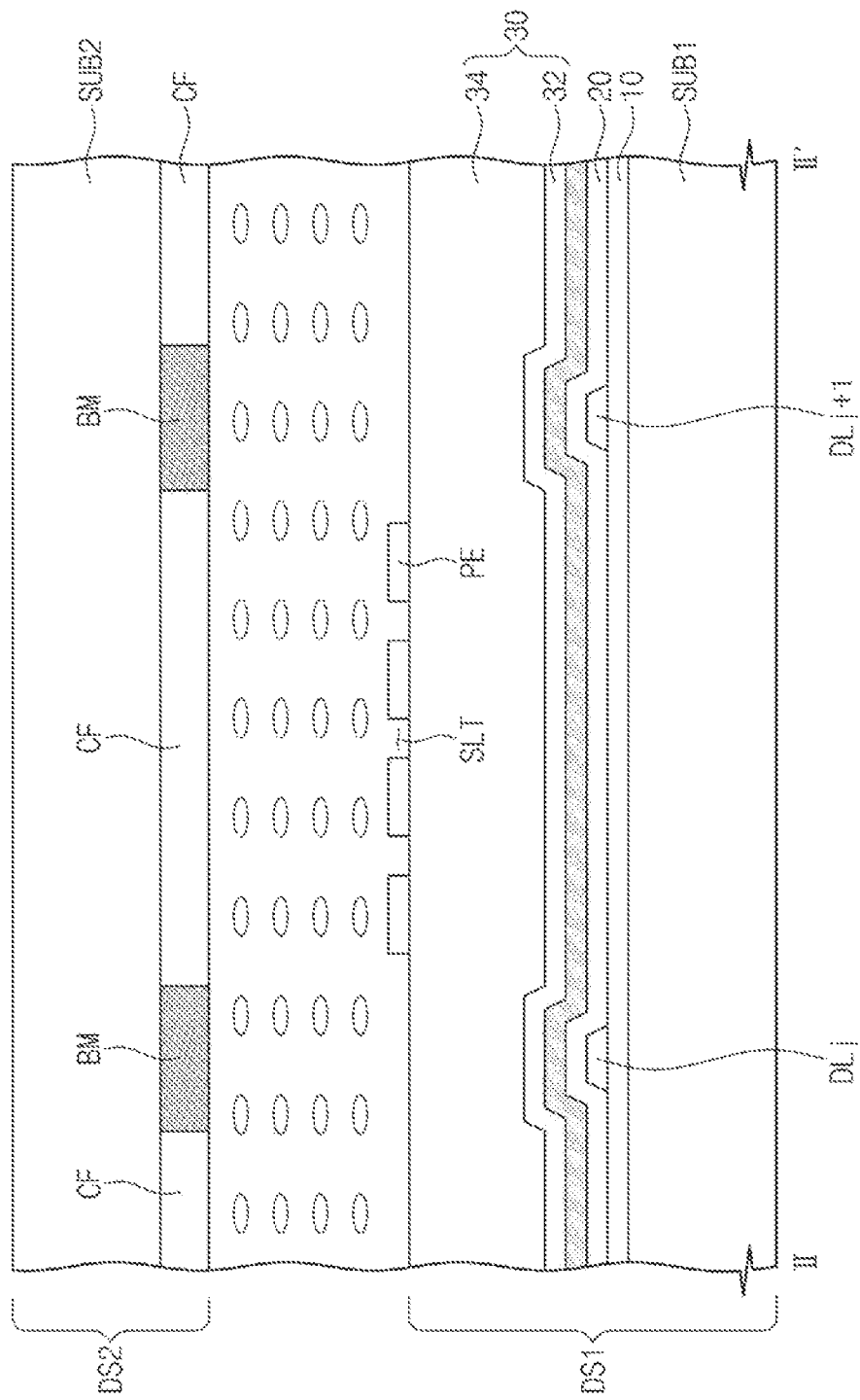
FIG. 5 is a sectional view of a display panel taken along a line II-II' of FIG. 3A.

FIG. 4 is a sectional view of a display panel taken along a line I-I' of FIG. 3A. FIG. 5 is a sectional view of a display panel taken along a line II-II' of FIG. 3A.

A first substrate DS1 includes a first base substrate SUB1 and a plurality of insulating layers 10, 20, and 30 and a plurality of conductive layers on the first substrate SUB1. The plurality of conductive layers configure a pixel PXij. Some of the conductive layers may include metals, such as Al, Ag, Cu, Mo, Cr, Ta, and Ti, and alloys thereof. Other ones of the conductive layers may include a transparent metal oxide, such as ITO. Each of the conductive layers may have either a single-layer structure or a multilayer structure.

The first base substrate SUB1 may be a transparent substrate, a plastic substrate, or a glass substrate. A first control electrode GE1-1 is disposed on one side of the first base substrate SUB1. Although not shown in the drawings, a barrier layer and/or a buffer layer may be further disposed on one side of the first base substrate SUB1. The first control electrode GE1-1 may be disposed on a barrier layer and/or a buffer layer.

A first insulating layer 10 covering the first control electrode GE1-1 is disposed on the first base substrate SUB1. The first insulating layer 10 may include at least one of a silicon nitride layer and a silicon oxide layer. The first active layer AL1-1 is disposed on the first insulating layer 10. The first active layer AL1-1 may include a semiconductor layer and an ohmic contact layer disposed on the semiconductor layer. The first active layer AL1-1 may include amorphous silicon, crystalline silicon, or a metal oxide semiconductor material.

The input electrode DE1 and the output electrode SE1 are disposed on the first insulating layer 10. The input electrode DE1 and the output electrode SE1 are spaced apart from each other. Each of the input electrode DE1 and the output electrode SE1 overlaps the first active layer AL1-1.

The second active layer AL1-2 is disposed on the first insulating layer 10. The second active layer AL1-2 overlaps the input electrode DE1 and the output electrode SE1. The second active layer AL1-2 may include an ohmic contact layer contacting the input electrode DE1 and the output electrode SE1, and a semiconductor layer disposed on the ohmic contact layer. The second active layer AL1-2 may include amorphous silicon, crystalline silicon, or a metal oxide semiconductor material.

A second insulating layer 20 covering the second active layer AL1-2 is disposed on the first insulating layer 10. The second insulating layer 20 may include at least one of a silicon nitride layer and a silicon oxide layer.

A second control electrode GE1-2 is disposed on the second insulating layer 20. The second control electrode GE1-2 overlaps the second active layer AL1-2. The first contact hole CH1 (see FIG. 3A) connecting the second control electrode GE1-2 and the ith gate line GLi (see FIG. 3A) may penetrate the first insulating layer 10 and the second insulating layer 20.

A common electrode CE is disposed on the second insulating layer 20. In order to prevent the short circuit of a pixel electrode PE described later and the common electrode CE, an opening OP is defined in the common electrode CE. The second control electrode GE1-2 and the common electrode CE may include the same material, for example, a transparent metal oxide.

A third insulating layer 30 covering the second control electrode GE1-2 and the common electrode CE is disposed on the second insulating layer 20. The third insulating layer 30 may include an inorganic layer 32 and an organic layer 34 providing a flat surface. The inorganic layer 32 may include at least one of a silicon nitride layer and a silicon oxide layer.

The pixel electrode PE is disposed on the third insulating layer 30. The pixel electrode PE and the output electrode SE1 are connected to each other through the second contact hole CH2 penetrating the second insulating layer 20 and the third insulating layer 30. The pixel electrode PE may include a transparent metal oxide, for example.

The switching transistor TR is turned on by a gate signal applied to the ith gate line GLi. As the switching transistor TR is turned on, the first active layer AL1-1 and the second active layer AL1-2 form two channels. A data signal applied to the jth data line DLj is delivered to the pixel electrode PE through the two channels.

The switching transistor TR according to this exemplary embodiment has a faster response time (or a faster signal delivery speed) than a switching transistor including one active layer. The switching transistor TR may be designed to have a response speed similar to that of a switching transistor including one active layer in a narrow area. Accordingly, an area that a switching transistor occupies in the display area DA (see FIG. 1) is reduced, and the aperture ratio of the pixel PXij is increased.

A second substrate DS2 includes a second base substrate SUB2, and a color filter CF and a black matrix BM on the second base substrate SUB2. The color filter CF may overlap the pixel electrode PE, and the black matrix BM may overlap the switching transistor TR, the ith gate line GLi, and the jth data line DLj. At least one of the color filter CF and the black matrix BM may be disposed on the first base substrate SUB1.

As with the switching transistor TR, a thin film transistor including two active layers and two control electrodes may be used in the gate driving circuit 100 (see FIG. 1). The gate driving circuit 100 includes stage circuits outputting the gate signals, and each of the stage circuits includes a plurality of thin film transistors (hereinafter referred to as "driving transistors"). At least some of the driving transistors may have the same structure as the switching transistor TR.

The driving transistor including two active layers may have a response speed similar to that of a thin film transistor including one active layer in an area that is narrower than that thereof. As an area that the driving transistors occupy is reduced, the area of the gate driving circuit 100 may be reduced. Accordingly, the area of the non-display area NDA (see FIG. 1) may be reduced. Hereinafter, description is made in more detail with reference to FIGS. 6 to 11.

Figure 6:
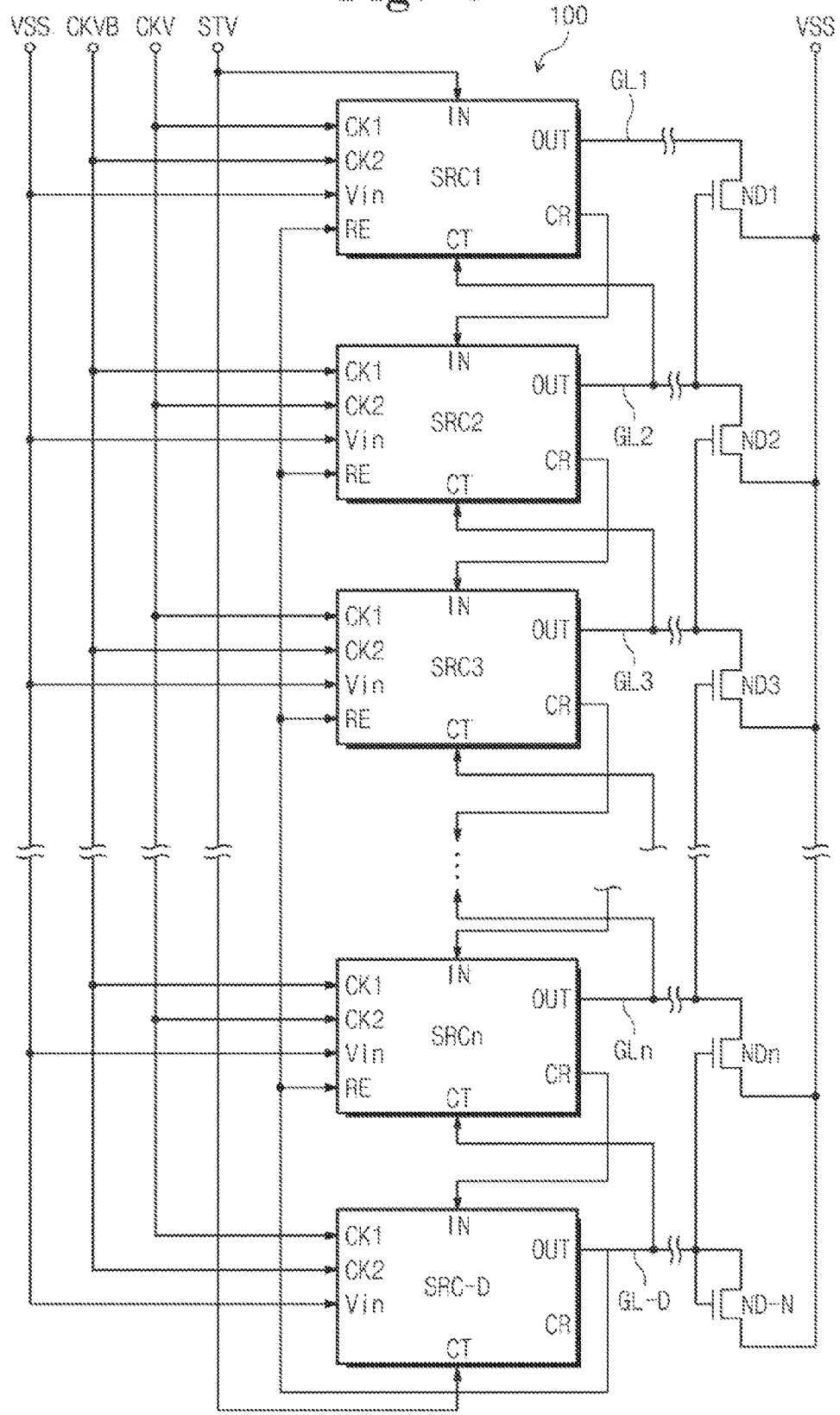
FIG. 6 is a block diagram of a gate driving circuit according to an exemplary embodiment of the present invention.

FIG. 6 is a block diagram of a gate driving circuit according to an exemplary embodiment of the present invention. As shown in FIG. 6, the gate driving circuit 100 includes a plurality of stage circuits SRC1 to SRCn. The stage circuits SRC1 to SRCn are connected to each other in a dependent manner.

The stage circuits SRC1 to SRCn are respectively connected to the gate lines GL1 to GLn. That is, the stage circuits SRC1 to SRCn provide gate signals to the gate lines GL1 to GLn, respectively.

The gate driving circuit 100 may further include a dummy stage SRC-D connected to the nth stage circuit SRCn among the stage circuits SRC1 to SRCn. The dummy stage SRC-D is connected to the dummy gate line GL-D.

Each of the stage circuits SRC1 to SRCn includes an output terminal OUT, an input terminal IN, a carry terminal CR, a control terminal CT, a reset terminal RE, a first clock terminal CK1, a second clock terminal CK2, and an off voltage input terminal Vin. The output terminal OUT of each of the plurality of stage circuits SRC1 to SRCn is connected to a corresponding gate line among the plurality of gate lines GL1 to GLn. Gate signals generated from the stage circuits SRC1 to SRCn are provided to the gate lines GL1 to GLn through the output terminal OUT.

The carry terminal CR of each of the stage circuits SRC1 to SRCn is electrically connected to the input terminal IN of the next stage circuit. The input terminal IN of each of the stage circuits SRC1 to SRCn receives a carry signal of a previous stage circuit. For example, the input terminal IN of the third stage circuit SRC3 receives a carry signal of the second stage signal SRC2. The input terminal IN of the first stage circuit SRC1 receives a start signal STV for starting the operation of the gate driving circuit 100 instead of the carry signal of the previous stage circuit.

The control terminal CT of each of the stage circuits SRC1 to SRCn is electrically connected to the output terminal OUT of the next stage circuit. The control terminal CT of each of the stage circuits SRC1 to SRCn receives a gate signal of the next stage circuit. For example, the control terminal CT of the second stage circuit SRC2 receives a gate signal outputted from the output terminal OUT of the third stage circuit SRC3.

The control terminal CT of the nth stage circuit SRCn receives a gate signal outputted from the output terminal OUT of the dummy stage SRC-D. The control terminal CT of the dummy stage SRC-D receives the start signal STV.

The reset terminal RE of each of the stage circuits SRC1 to SRCn receives a gate signal outputted from the output terminal OUT of the dummy stage SRC-D. The first clock terminal CK1 and the second clock terminal CK2 of each of the stage circuits SRC1 to SRCn receive one of a first clock signal CKV and a second clock signal CKVB. The first clock terminal CK1 and the second clock terminal CK2 of each of the odd-numbered stage circuits SRC1 and SRC3 may receive the first clock signal CKV and the second clock signal CKVB, respectively. The first clock terminal CK1 and the second clock terminal CK2 of each of the even-numbered stage circuits SRC2 and SRCn may receive the second clock signal CKVB and the first clock signal CKV, respectively.

The off voltage input terminal Vin of each of the stage circuits SRC1 to SRCn receives an off voltage VSS. The off voltage VSS may be a minus voltage. For example, the off voltage VSS may be about −7 V or about −12 V.

Each of a plurality of discharge transistors ND1 to NDn is connected to the right end of a corresponding gate line among the plurality of gate lines GL1 to GLn. Each of the discharge transistors ND1 to NDn includes a control electrode connected to the next gate line, an input electrode receiving the off voltage VSS, and an output electrode connected to the corresponding gate line. Each of the discharge transistors ND1 to NDn may discharge the corresponding gate line to the off voltage VSS in response to a gate signal applied to the next gate line.

The dummy discharge transistor ND-D is connected to the right end of the dummy gate line GL-D. The dummy discharge transistor ND-D may discharge the dummy gate line to the off voltage VSS in response to a dummy gate signal.

According to an exemplary embodiment of the present invention, in relation to each of the stage circuits SRC1 to SRCn, one of the output terminal OUT, the input terminal IN, the carry terminal CR, the control terminal CT, the reset terminal RE, the first clock terminal CK1, the second clock terminal CK2, and the off voltage input terminal Vin may be omitted, or other terminals may be further included according to its circuit configuration. Moreover, a connection relationship of the stage circuits SRC1 to SRCn may be changed.

Figure 7:
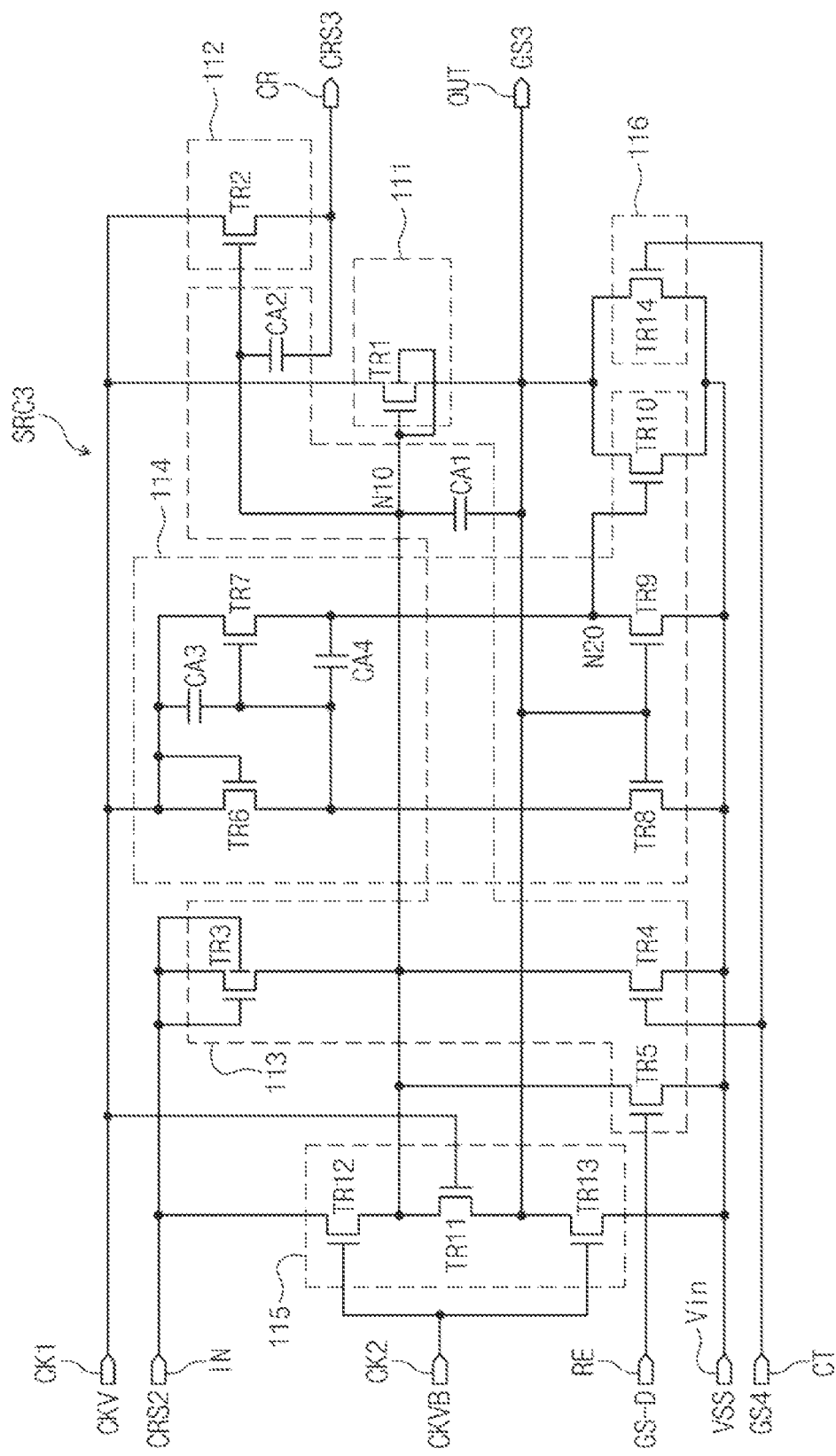
FIG. 7 is a circuit diagram of one of a plurality of stage circuits shown in FIG. 6.
Figure 8:
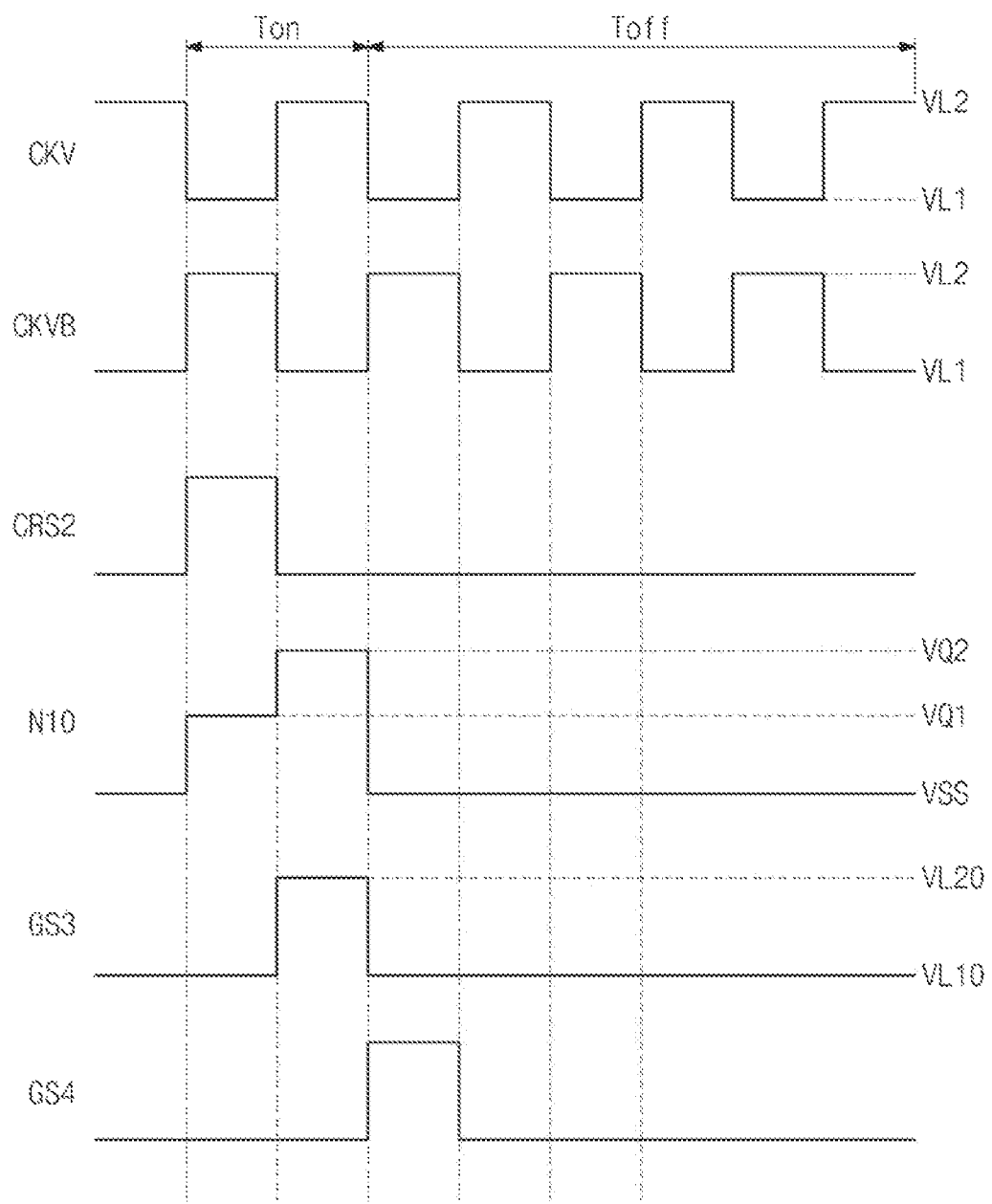
FIG. 8 is an input/output signal waveform of one stage circuit.

FIG. 7 is a circuit diagram illustrating one stage circuit of the stage circuits SRC1 to SRCn. FIG. 8 is an input/output signal waveform of the one stage circuit. FIG. 7 illustrates a third stage circuit SRC3 among the stage circuits SRC1 to SRCn shown in FIG. 6. Each of the stage circuits SRC1 to SRCn shown in FIG. 7 may have the same circuit as the third stage circuit SRC3.

The third stage circuit SRC3 in an exemplary embodiment may include a first output unit 111, a second output unit 112, a control unit 113, a holding unit 114, a stabilization unit 115, and a pull-down unit 116. The first output unit 111 outputs a gate signal GS3 to the third gate line GL3 (see FIG. 4) and the second output unit 112 provides a carry signal CRS3 to a fourth stage circuit (not shown).

The control unit 113 controls operations of the first output unit 111 and the second output unit 112. The control unit 113 turns on the first output unit 111 and the second output unit 112 in response to a carry signal CRS2 outputted from the second stage circuit SRC2. The control unit 113 turns off the first output unit 111 and the second output unit 112 in response to a gate signal GS4 outputted from the fourth stage circuit.

The holding unit 114 holds the potential of the output terminal OUT to the off voltage VSS during an off section Toff (see FIG. 8) of the first output unit. The stabilization unit 115 prevents ripples in the gate signal GS3 outputted from the first output unit 111 and the carry signal CRS3 outputted from the second output unit 112 caused by the first clock signal CKV or the second clock signal CKVB.

The pull-down unit 116 pulls down the potential of the output terminal OUT to the off voltage VSS in response to the gate signal GS4 of the fourth stage circuit. However, in other exemplary embodiments, the pull-down unit 116 may be omitted.

The first output unit 111, the second output unit 112, the control unit 113, the holding unit 114, the stabilization unit 115, and the pull-down unit 116 may include a driving transistor having a structure including two active layers and two control electrodes, as in the switching transistor TR (see FIGS. 2 and 4). According to this exemplary embodiment, the two driving transistors TR1 and TR3 in the first output unit 111 and the control unit 113 have the same structure as the switching transistor TR. However, in other exemplary embodiments of the present invention, all driving transistors in the third stage circuit SRC3 may have the same structure as the switching transistor TR.

A configuration and operation of the third stage circuit SRC3 will be described in more detail with reference to FIGS. 7 and 8.

The first output unit 111 includes a first output transistor TR1. The first output transistor TR1 includes an input electrode receiving the first clock signal CKV, a first control electrode and a second control electrode connected to the control unit 113, and an output electrode outputting the gate signal GS3. The output electrode of the first output transistor TR1 configures the output terminal of the first output unit 111. The first control electrode and the second control electrode of the first output transistor TR1 are connected to a first node N10, that is, an output terminal of the control unit 113.

The second output unit 112 includes a second output transistor TR2. The second output transistor TR2 includes an input electrode receiving the first clock signal CKV, a control electrode connected to the control electrode of the first output transistor TR1, and an output electrode outputting the carry signal CSR3.

The first clock signal CKV and the second clock signal CKVB are signals having an inverted phase. The first clock signal CKV and the second clock signal CKVB may have a phase difference of 180°. Each of the first clock signal CKV and the second clock signal CKVB includes low level sections and high level sections. Each of the first clock signal CKV and the second clock signal CKVB includes alternating low level and high level sections.

Each of the first clock signal CKV and the second clock signal CKVB has a first level VL1 during a low section. The first level VL1 may be identical to the level of the off voltage VSS. Each of the first clock signal CKV and the second clock signal CKVB has a second level VL2 higher than the first level VL1 during a high section.

The control unit 113 includes a first control transistor TR3, a second control transistor TR4, a third control transistor TR4, a first capacitor CA1, and a second capacitor CA2.

The first control transistor TR3 includes a first control electrode and a second control electrode commonly receiving the carry signal CRS2 of the second stage circuit SRC2. Additionally, the first control transistor TR3 includes an input electrode receiving the carry signal CRS2 of the second stage circuit SRC2. The first control transistor TR3 includes an output electrode connected to the first node N10. The second control transistor TR4 includes an output electrode connected to the first node N10, a control electrode receiving the gate signal GS4 of the fourth stage circuit, and an input electrode receiving the off voltage VSS.

The third control transistor TR5 includes a control electrode connected to the reset terminal RE, an input electrode connected to the off voltage input terminal Vin, and an output electrode connected to the first node N10.

The first electrode of the first capacitor CA1 is connected to the control electrode of the first output transistor TR1 and the second electrode of the first capacitor CA1 is connected to the output electrode of the first output transistor TR1. The first electrode of the second capacitor CA2 is connected to the control electrode of the second output transistor TR2 and the second electrode of the second capacitor CA2 is connected to the output electrode of the second output transistor TR2.

When the first control transistor TR3 is turned on during a high section of the carrier signal CRS2 of the second stage circuit SRC2, the potential of the first node N10 rises to a first high voltage VQ1, and the first output transistor TR1 and the second output transistor TR2 are turned on.

When the potential of the first node N10 rises to a first high voltage VQ1, the first capacitor CA1 is charged with a voltage corresponding thereto. Then, the first output transistor TR1 is bootstrapped. Accordingly, the first node N10 is boosted from the first high voltage VQ1 to a second high voltage VQ2. When the first node N10 is boosted to the second high voltage VQ2, the first output transistor TR1 outputs a gate signal GS3.

The gate signal GS3 has a first level VL10 during a low section and has a second level VL20 higher than the first level VL10 during a high section. The first level VL10 may be identical to the level of the off voltage VSS.

A section where the first output transistor TR1 is turned on, that is, a section where the first node N10 has the first high voltage VQ1 of the second high voltage VQ2, is defined as an "on" section Ton of the first output unit 111. A section after the "on" section Ton of the output unit 111 is defined as an "off" section Toff of the first output unit 111.

During a high section of a gate signal GS4 outputted from the fourth stage circuit, as the second control transistor TR4 is turned on, the potential of the first node N10 is reduced. The potential of the first node N10 is reduced down to the off voltage VSS. When the potential of the first node N10 is reduced, the first output transistor TR1 and the second output transistor TR2 are turned off.

In response to the gate signal GS-D of the dummy stage SRC-D (see FIG. 6), the third control transistor TR5 is turned on. As the third control transistor TR5 is turned on, the potential of the first node N10 is reset to the off voltage VSS.

The holding unit 114 includes first to fifth inverter transistors TR6, TR7, TR8, TR9, and TR10, and third and fourth capacitors CA3 and CA4. The first inverter transistor TR6 includes an input electrode and a control electrode commonly connected to a first clock terminal CK1, and an output electrode connected to the fourth capacitor CA4. The second inverter transistor TR7 includes an input electrode connected to a first clock terminal CK1, a control electrode connected to the third capacitor CA3, and an output electrode connected to the fourth capacitor CA4.

The third capacitor CA3 includes a first electrode connected to an input electrode, and a control electrode of the first inverter transistor TR6 and a second electrode connected to a control electrode of the second inverter transistor TR7. The fourth capacitor CA4 includes a first electrode connected to the first clock terminal CK1 and a second electrode connected to a control electrode of the second inverter transistor TR7.

The third inverter transistor TR8 includes an input electrode connected to an output electrode of the first inverter transistor TR6, a control electrode connected to the output terminal OUT, and an output electrode connected to the off voltage input terminal Vin. The fourth inverter transistor TR9 includes an input electrode connected to an output electrode of the second inverter transistor TR7, a control electrode connected to the output terminal OUT, and an output electrode connected to the off voltage input terminal Vin.

The fifth inverter transistor TR10 includes a control electrode connected to an input electrode of the fourth inverter transistor TR9, an output electrode connected to the output terminal OUT, and an input electrode connected to the off voltage input terminal Vin. The output electrode of the second inverter transistor TR7, the input electrode of the fourth inverter transistor TR9, and the control electrode of the fifth inverter transistor TR10 are connected to a second node N20.

The third and fourth inverter transistors TR8 and TR9 are turned on in response to the gate signal GS3 outputted to the output terminal OUT. At this point, the first clock signal CKV outputted from the first and second inverter transistors TR6 and TR7 is discharged to the off voltage VSS. Accordingly, the fifth inverter transistor TR10 maintains a turn-off state during a high section of the gate signal GS3.

Then, as the gate signal GS3 switches to a low level, that is, during an off section Toff of the output unit 111, the third and fourth inverter transistors TR8 and TR9 are turned off. During the "off" section Toff of the first output unit 111, the fifth inverter transistor TR10 is turned on in correspondence to a high section of the first clock signal CKV outputted from the first and second inverter transistors TR6 and TR7. As the fifth inverter transistor TR10 is turned on, the potential of the output terminal OUT is held to the off voltage VSS in correspondence to the low section of the first clock signal CKV.

The stabilization unit 115 includes first to third stabilization transistors TR11, TR12, and TR13. The first stabilization transistor TR11 includes a control electrode connected to the first clock terminal CK1, an input electrode connected to the output terminal OUT, and an output electrode connected to the first node N10. The second stabilization transistor TR12 includes a control electrode connected to the second clock terminal CK2, an input electrode connected to the input terminal IN, and an output electrode connected to the first node N10. The third stabilization transistor TR13 includes a control electrode connected to the second clock terminal CK2, an output electrode connected to the output terminal OUT, and an input electrode connected to the off voltage input terminal Vin.

During the "off" section Toff of the first output unit 111, the first stabilization transistor TR11 is turned on in correspondence to a high section of the first clock signal CKV. During the "off" section Toff of the first output unit 111, the first stabilization transistor TR11 connects the output terminal OUT and the first node N10 electrically in response to the first clock signal CKV. During the "off" section Toff of the output unit 111, as the output terminal OUT is held to the off voltage VSS, the first node N10 electrically connected to the output terminal OUT is held also to the off voltage VSS.

During the "off" section Toff of the first output unit 111, the second stabilization transistor TR12 is turned on in correspondence to a high section of the second clock signal CKVB. During the "off" section Toff of the first output unit 111, the second stabilization transistor TR12 connects the input terminal IN and the first node N10 electrically in response to the second clock signal CKVB. During the "off" section Toff of the first node N10, as the input terminal UB is held to the off voltage VSS, the first node N10 electrically connected to the input terminal IN is held also to the off voltage VSS.

During the "off" section Toff of the first output unit 111, the third stabilization transistor TR13 is turned on in correspondence to a high section of the second clock signal CKVB. During the "off" section Toff of the first output unit 111, the third stabilization transistor TR13 holds the output terminal OUT to the off voltage VSS in response to the second clock signal CKVB.

The pull-down unit 116 includes a pull-down transistor TR14. The pull-down transistor TR14 includes a control electrode connected to the control terminal CT, an input electrode connected to the off voltage input terminal Vin, and an output electrode connected to the output terminal OUT. The pull-down transistor TR14 pulls down the potential of the output terminal OUT to the off voltage VSS during a high section of a gate signal GS4 outputted from the fourth stage circuit.

Figure 9:
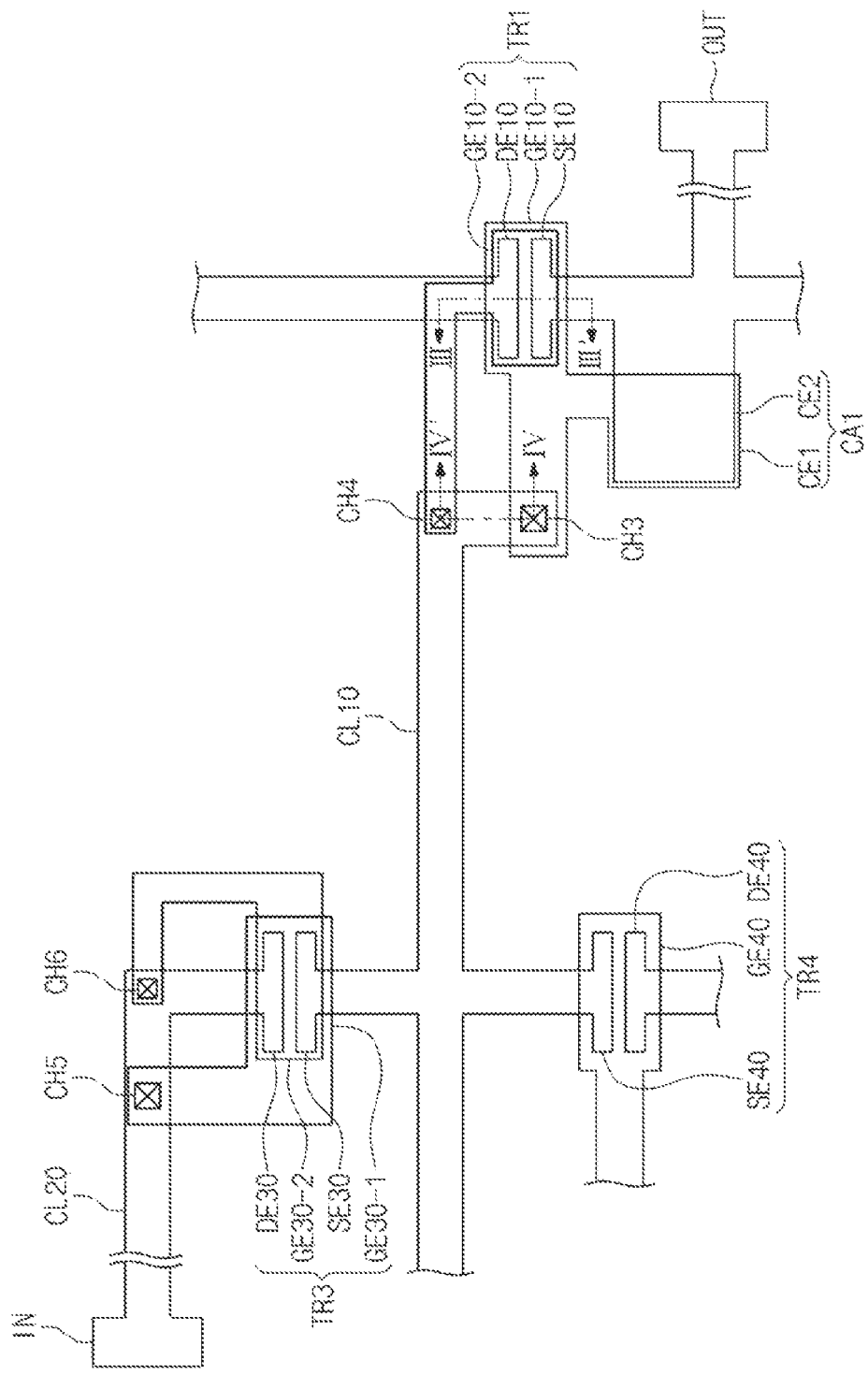
FIG. 9 is a partial layout diagram of a stage circuit shown in FIG. 7.
Figure 10:
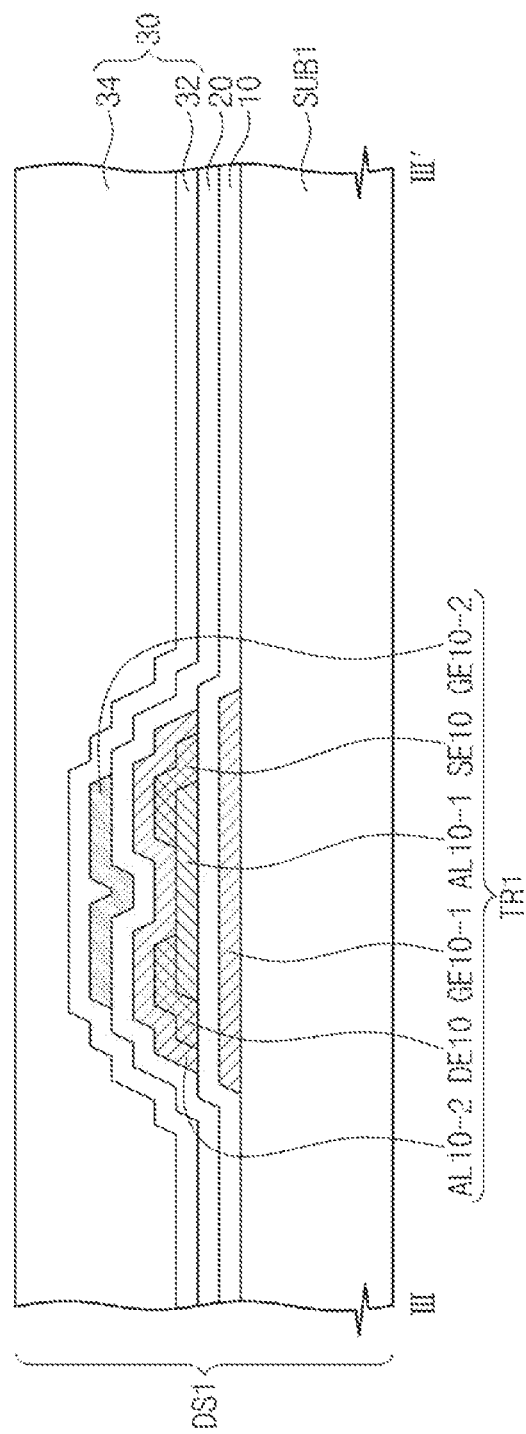
FIG. 10 is a sectional view taken along a line III-III' of FIG. 9.

FIG. 9 is a partial layout diagram of a stage circuit shown in FIG. 7. FIG. 10 is a sectional view taken along a line III-III', and FIG. 11 is a sectional view taken along a line IV-IV' of FIG. 9.

The first output transistor TR1, the first control transistor TR3, and the second control transistor TR4 of the third stage circuit SRC3 (see FIG. 7) are shown in FIG. 9. Active layers are not shown in FIG. 9.

The third stage circuit SRC3 manufactured through the same thin film process as the pixel PXij includes a plurality of insulating layers, a plurality of active layers, and a plurality of conductive layers. A plurality of electrodes and wires may be formed by patterning the conductive layers. The conductive layers may include a first conductive layer disposed on the same layer as the ith gate line GLi, and a second conductive layer disposed on the same layer as the jth data line DLj.

Figure 11:
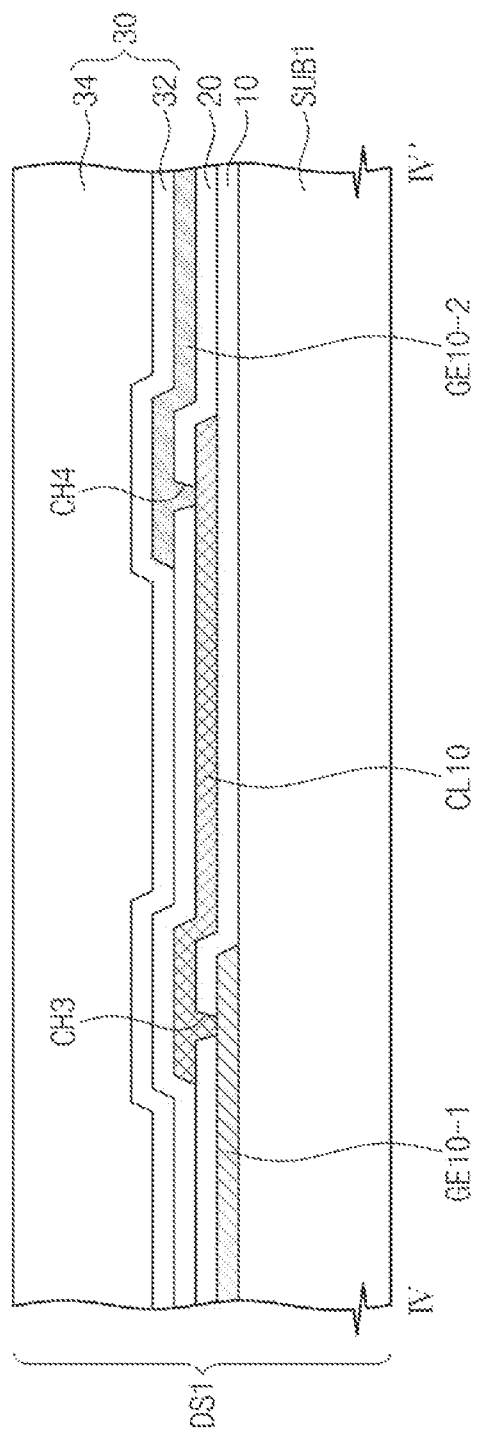
FIG. 11 is a sectional view taken along a line IV-IV' of FIG. 9.

As shown in FIGS. 9 to 11, the first control electrode GE10-1 of the first output transistor TR1 is disposed on the first base substrate SUB1. Also, the first control electrode GE30-1 of the first control transistor TR3, and the control electrodes GE40 of the second control transistor TR4 are disposed on the same layer as the first control electrode GE10-1 of the first output transistor TR1. Other wires may be disposed on the same layer as the first control electrode GE10-1 of the first output transistor TR1.

A first insulating layer 10 covering the first control electrode GE10-1 of the first output transistor TR1 is disposed on the first base substrate SUB1. The first insulating layer 10 has the same integrated form as the insulating layer covering the first control electrode GE1-1 of the switching transistor TR (see FIG. 4). Also, the first control electrode GE30-1 of the first control transistor TR3 and the control electrodes GE40 of the second control transistor TR4 are covered by the first insulating layer 10.

A first active layer AL10-1 of the first output transistor TR1 is disposed on the first insulating layer 10. Although not shown in the drawings, a first active layer of the first control transistor TR3 and an active layer of the second control transistor TR4 are disposed on the first insulating layer 10. The first active layer AL10-1 of the first output transistor TR1 includes the same material and is disposed on the same layer as the first active layer AL1-1 of the switching transistor TR.

An input electrode 10 and an output electrode SE10 of the first output transistor TR1 are disposed on the first insulating layer 10. The input electrode DE10 and the output electrode SE10 of the first output transistor TR1 are spaced apart from each other. Each of the input electrode DE10 and the output electrode SE10 of the first output transistor TR1 overlaps the first active layer AL10-1.

An input electrode DE30 and an output electrode SE30 of the first control transistor TR3 are disposed on the first insulating layer 10. Additionally, an input electrode DE40 and an output electrode SE40 of the second control transistor TR4 are disposed on the first insulating layer 10. A first wire CL10 and a second wire CL20 are disposed on the first insulating layer 10. The first wire CL10 may be connected to the first control electrode GE10-1 of the first output transistor TR1 through a contact hole CH3 penetrating the first insulating layer 10. The first wire CL10 is connected to the output electrode SE30 of the first control transistor TR3 and the output electrode SE40 of the second control transistor TR4. The first wire CL10 may correspond to the first node N10 shown in FIG. 7.

The second wire CL20 may be connected to the first control electrode GE30-1 of the first control transistor TR3 through a contact hole CH5 penetrating the first insulating layer 10. The second wire CL20 is connected to the output electrode DE30 of the first control transistor TR3.

A second active layer AL10-2 of the first output transistor TR1 is disposed on the first insulating layer 10. The second active layer AL10-2 of the first output transistor TR1 overlaps the input electrode DE10 of the first output transistor TR1 and the output electrode SE10 of the first output transistor TR1. The second active layer AL10-2 of the first output transistor TR1 includes the same material and is disposed on the same layer as the second active layer AL1-2 of the switching transistor TR. Although not shown in the drawings, a second active layer of the first control transistor TR3 is disposed on the first insulating layer 10.

A second insulating layer 20 covering the second active layer AL10-2 of the first output transistor TR1 is disposed on the first insulating layer 10. The second insulating layer 20 is identical to the insulating layer 20 covering the second active layer AL1-2 of the switching transistor TR.

A second control electrode GE10-2 of the first output transistor TR1 is disposed on the second insulating layer 20. The second control electrode GE10-2 of the first output transistor TR1 may be connected to the first wire CL10 through a contact hole CH4 penetrating the second insulating layer 20. As a result, the first control electrode GE10-1 and the second control electrode GE10-2 of the first output transistor TR1 may receive the same signal through the first wire CL10.

A second control electrode GE30-2 of the first control transistor TR3 is disposed on the second insulating layer 20. The second control electrode GE30-2 of the first control transistor TR3 may be connected to the second wire CL20 through a contact hole CH6 penetrating the second insulating layer 20.

Also, the second control electrode GE10-2 of the first output transistor TR1 and the second control electrode GE30-2 of the first control transistor TR3 may include the same material as the common electrode CE (see FIG. 4), for example, a transparent metal oxide. A third insulating layer 30 covering the second control electrode GE10-2 of the first output transistor TR1 and the second control electrode GE30-2 of the first control transistor TR3 is disposed on the second insulating layer 20. The third insulating layer 30 may include an inorganic layer 32 and an organic layer 34 providing a flat surface.

The first control electrode GE10-1 of the first output transistor TR1 is connected to the first electrode CE1 of the first capacitor CA1. The output electrode SE10 of the first output transistor TR1 is connected to the second electrode CE2 of the first capacitor CA1. The second wire CL20 may be connected to the input terminal IN. The output electrode SE10 of the first output transistor TR1 may be connected to the output terminal OUT.

As described above, a switching transistor including two active layers has a faster response speed than a switching transistor including one active layer. The switching transistor including two active layers may be designed to have a response speed similar to that of the switching transistor including one active layer in a narrow area. Accordingly, the area occupied by a switching transistor may be reduced and the aperture ratio of a display panel is increased.

The driving transistors of the gate driving circuit may have the same structure as the switching transistor. The driving transistors may be designed to have a similar response speed to a switching transistor including one active layer in a narrow area. As an area occupied by the driving transistors is reduced, the area of the non-display area where the gate driving circuit is disposed may be reduced.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
   a first base substrate comprising a display area and a non-display area adjacent to the display area;
   signal lines comprising gate lines and data lines insulated from each other and intersecting each other disposed in the display area;
   pixels disposed in the display area and connected to the signal lines; and
   a driving circuit disposed in the non-display area and configured to provide driving signals to the signal lines, wherein:
   each of the pixels comprises:
      a switching transistor connected to a corresponding gate line and a corresponding data line; and
      a display element connected to the switching transistor; and the switching transistor comprises:
      a first control electrode disposed on one side of the first base substrate;
      a first active layer disposed on the first control electrode;
      a first input electrode and a first output electrode disposed on the first active layer;
   a second active layer disposed on the first active layer and covering the first input electrode and the first output electrode; and
   a second control electrode disposed on the second active layer and electrically connected to the first control electrode through a same corresponding gate line.

2. The display device of claim 1, wherein the driving circuit comprises:
   a gate driving circuit outputting gate signals to the gate lines: and
   a data driving circuit outputting data signals to the data lines.

3. The display device of claim 2, wherein:
   the first control electrode is disposed on the one side of the first base substrate and is connected to a corresponding gate line; and
   the first input electrode is disposed on the first insulating layer covering the first control electrode and is connected to a corresponding data line.

4. The display device of claim 3, further comprising a second base substrate facing the first base substrate and a liquid crystal layer disposed between the first base substrate and the second base substrate,
   wherein the display element comprises:
      a pixel electrode connected to the output electrode of the switching transistor and comprising a plurality of defined slits: and
      a common electrode overlapping the pixel electrode.

5. The display device of claim 4, wherein:
   the common electrode and the second control electrode are disposed on a second insulating layer covering the second active layer; and
   the second control electrode is connected to the corresponding gate line through a first contact hole penetrating the first insulating layer and the second insulating layer.

6. The display device of claim 5, wherein the pixel electrode is disposed on a third insulating layer covering the common electrode and the second control electrode.

7. The display device of claim 6, wherein the pixel electrode is connected to the first output electrode through a second contact hole penetrating the second insulating layer and the third insulating layer.

8. The display device of claim 5, further comprising a color filter disposed on one of the first base substrate and the second base substrate,
   wherein the color filter overlaps the pixel electrode.

9. The display device of claim 8, further comprising a black matrix disposed on one of the first base substrate and the second base substrate,
   wherein the black matrix overlaps the corresponding gate line, the corresponding data line, and the switching transistor.

10. The display device of claim 2, wherein:
    the gate driving circuit comprises stage circuits outputting the gate signals, each of the stage circuits comprising a plurality of driving transistors; and
    at least one of the driving transistors comprises:
       a third control electrode disposed on the one side of the first base substrate;
       a third active layer disposed on the third control electrode;
       a second input electrode and a second output electrode disposed on the third active layer;
       a fourth active layer disposed on the third active layer and covering the second input electrode and the second output electrode; and
       a fourth control electrode disposed on the fourth active layer and electrically connected to the third control electrode.

11. The display device of claim 10, wherein:
    the first active layer and the third active layer comprise the same material and are disposed on the same layer; and
    the second active layer and the fourth active layer comprise the same material and are disposed on the same layer.

12. The display device of claim 10, wherein the second control electrode and the fourth control electrode comprise the same material and are disposed on the same layer.

13. The display device of claim 10, wherein each of the stage circuits comprises:
    a first output configured to receive a clock signal and output a corresponding gate signal;

a second output unit configured to output a carry signal;
a control unit configured to control on/off of the first output unit and the second output unit;
a holding unit configured to hold an output terminal of the first output unit at an "off" voltage level during an "off" section of the first output unit;
a stabilization unit configured to prevent rippling of the gate signal and the carry signal by the clock signal; and
a pull-down unit configured to pull down the output terminal of the first output unit to the "off" voltage level during the "off" section of the first output unit,
wherein the first output unit, the second output unit, the control unit, the holding unit, the stabilization unit, and the pull-down unit form a driving transistor having the same structure as the at least one driving transistor.

* * * * *